United States Patent [19]
Gullapalli et al.

[11] Patent Number: 5,594,336
[45] Date of Patent: Jan. 14, 1997

[54] THREE POINT TECHNIQUE USING SPIN AND GRADIENT ECHOES FOR WATER/FAT SEPARATION

[75] Inventors: Rao P. Gullapalli, Richmond Heights; Haiying Liu, Euclid; Mark J. Loncar, Willoughby Hills, all of Ohio

[73] Assignee: Picker International, Inc., Highland Heights, Ohio

[21] Appl. No.: 459,051

[22] Filed: Jun. 2, 1995

[51] Int. Cl.⁶ .................................................. G01R 33/48
[52] U.S. Cl. ............................................................ 324/309
[58] Field of Search .................................. 324/309, 307, 324/300, 314; 128/653.2

[56] References Cited

U.S. PATENT DOCUMENTS

| | | | |
|---|---|---|---|
| 4,792,758 | 12/1988 | Sattin | 324/309 |
| 4,833,407 | 5/1989 | Holland et al. | 324/309 |
| 4,871,967 | 10/1989 | Rotem et al. | 324/309 |
| 4,896,113 | 1/1990 | Pelc | 324/309 |
| 4,901,020 | 2/1990 | Ladebeck et al. | 324/309 |
| 4,949,042 | 8/1990 | Kuhara et al. | 324/311 |
| 4,959,611 | 9/1990 | Brovost et al. | 324/309 |
| 4,970,465 | 11/1990 | Hagiwara | 324/309 |
| 5,043,665 | 8/1991 | Kuhara et al. | 324/309 |
| 5,051,699 | 9/1991 | Hanawa et al. | 324/309 |
| 5,125,407 | 6/1992 | Harms et al. | 324/309 |
| 5,270,654 | 12/1993 | Feinberg et al. | 324/309 |
| 5,311,133 | 5/1994 | Dannels | 324/309 |
| 5,321,359 | 6/1994 | Schneider | 324/309 |
| 5,348,011 | 9/1994 | NessAiver | 128/653.2 |

OTHER PUBLICATIONS

"Double–Echo Phase–Sensitive Method for Fat Suppression MRI", Szumowski, et al., p. 418 (1994).

"GRASE (Gradient and Spin–Echo) MR Imaging: A New Fast Clinical Imaging Technique", Feinberg, Radiology 1991; 181:597–602.

"Separation of True Fat and Water Images by Correcting Magnetic Field Inhomogeneity in Situ", Yeung, et al., Radiology 1986; 159:783–786.

(List continued on next page.)

*Primary Examiner*—Sandra L. O'Shea
*Assistant Examiner*—Raymond Y. Mah
*Attorney, Agent, or Firm*—Fay, Sharpe, Beall, Fagan, Minnich & McKee

[57] ABSTRACT

Magnetic resonance is excited (50) in first and second species dipoles of a subject in a temporally constant magnetic field. The resonance is refocused (52) to generate a spin echo (54) centered at a time when the first and second species resonance signals are in-phase. Gradients echoes (64, 68) are generated, centered at a time $(2n+1)\pi/\delta\omega$ before and after the spin echo, where $\delta\omega$ is a difference between the first and second species resonance frequencies. In this manner, the first and second species signals are 180° out-of-phase in the gradient echoes. The resonance is refocused (82) one or more times to generate additional spin and gradient echoes with different phase encodings (78). The sequence is repeated with yet more phase encodings, and magnetic resonance signals from the spin echo and the two gradient echoes are reconstructed (86) into a spin echo image ($s_0$) and a pair of gradient echo images ($s_{+1}$, $s_{-1}$). A phase map is generated (90) from the spin and gradient echo images. One of the gradient echo images is corrected (116) with the phase map. The phase corrected gradient image is additively combined (118) with the spin echo image to generate a first species image (112) and is subtractively combined (120) to generate a second species image (114).

16 Claims, 3 Drawing Sheets

OTHER PUBLICATIONS

"Three-Point Dixon Technique for True Water/Fat Decomposition with $B_O$ Inhomogeneity Correction", Glover, Mag. Res. n Med., 18, 371–383 (1991).

"Prostatic MR Imaging Performed with the Three-Point Dixon Technique" Tamler, et al., Radiology 1991; 179:43–47.

"Fat-Suppression MR Imaging in Neuroradiology: Techniques and Clinical Appllication", Tien, AJR 158:369–379, Feb. 1992.

"A Novel Three Point Technique for Seperation of Water/Fat Using the Fast Spin Echo Technique", Gullapalli, et al., 1994 Abstract SMRM.

"Zonally Magnified EPI in Real Time by NMR", Mansfield, et al., J. Phys. E:Sci. Instrum. 21 (1988) 275–280.

"Echo Planar—Inner Volume Imaging at 0.35T", Feinberg, et al., Radiologic Imaging Laboratory, Univ. of CA, vol. 161 (1986) pp. 950.

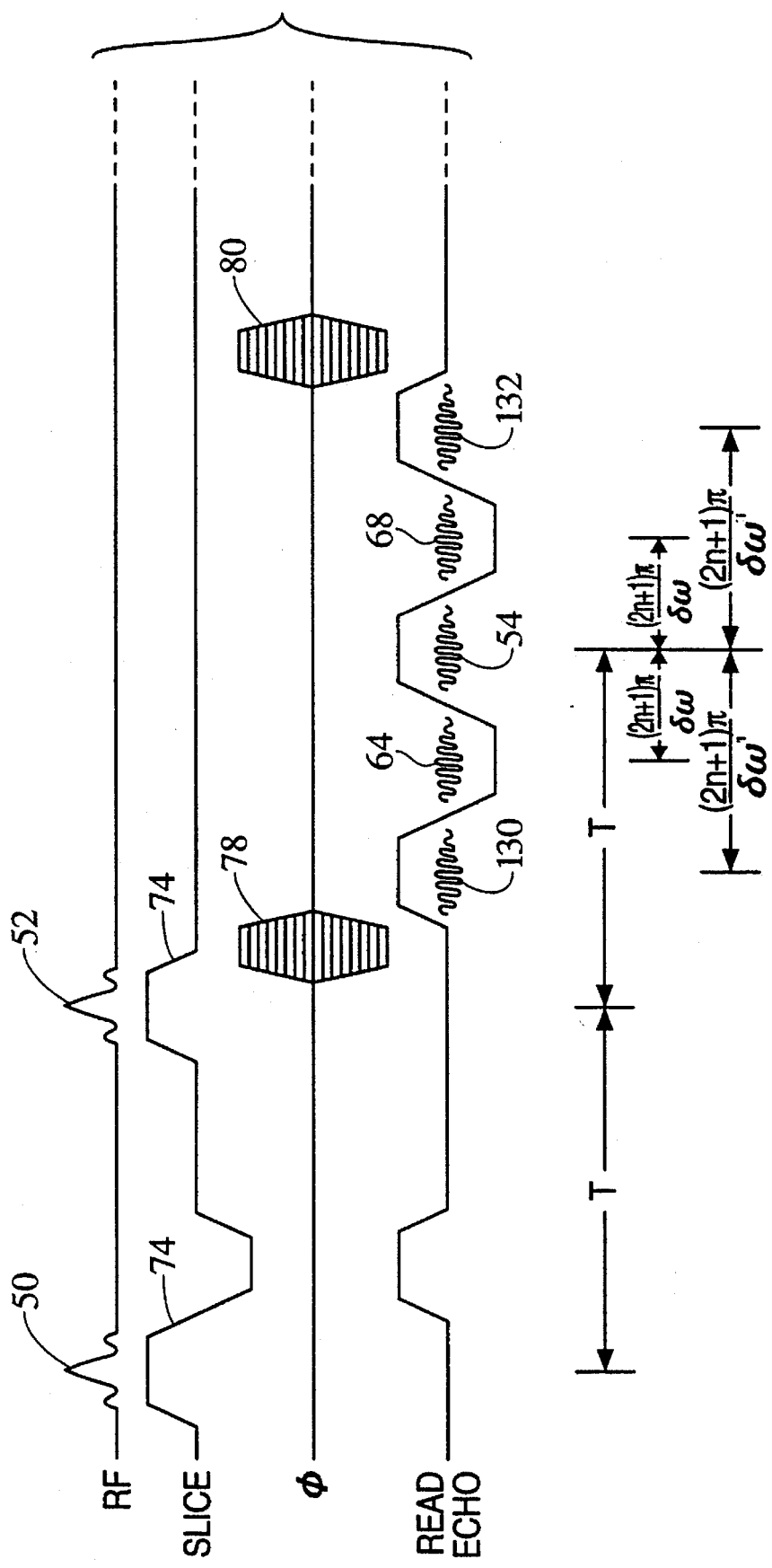

5,594,336

THREE POINT TECHNIQUE USING SPIN AND GRADIENT ECHOES FOR WATER/FAT SEPARATION

BACKGROUND OF THE INVENTION

The present invention relates to the magnetic resonance imaging arts. It finds particular application in conjunction with the separation of water and fat signals from human patients and will be described with particular reference thereto. However, it is to be appreciated that the present technique is also applicable to imaging sequences in which components of the imaged region have very close resonance frequencies.

Heretofore, subjects have been positioned in a temporally constant magnetic field such that selected dipoles preferentially align with the magnetic field. Radio frequency signals have been applied to cause magnetic resonance of the preferentially aligned dipoles. The radio frequency magnetic resonance signal from the resonating dipoles has been read out for reconstruction into an image representation.

To strengthen the magnetic resonance signal, the resonance can be excited with a 90° radio frequency pulse followed by a 180° refocusing pulse. The 180° refocusing pulse causes the resonating spin system to refocus as a spin echo. The time between the 180° refocusing pulse and the spin echo is the same as the time between the 90° excitation pulse and the 180° refocusing pulse.

Magnetic resonance echoes can also be induced by other disturbances of the spin system, such as reversing the polarity of a magnetic field gradient to induce a gradient echo.

As illustrated in U.S. Pat. No. 4,833,407 of Holland, Provost, DeMeester, and Denison, spin and gradient echoes have been induced interleaved in the same repetition of the magnetic resonance imaging sequence. Briefly summarized, an RF excitation and refocusing pulse were applied to induce a spin echo. The polarity of a magnetic field gradient along a read axis was reversed one or more times to induce one or more gradient echoes. When used with fast spin echo (FSE) techniques, refocusing radio frequency pulses are applied after each spin echo to induce yet another spin echo.

As indicated above, water and fat have close resonance frequencies, but differ by about 220 Hertz in a magnetic field of 1.5 Tesla. In the 1.5 Tesla field, the 220 Hertz higher frequency component gains a full revolution on the slower component every 4.46 msec. That is, the signals are in-phase with a 4.46 msec. periodicity. By inducing one echo at 2.23 msec. after refocusing and another echo at 4.46 msec. after refocusing, a pair of echoes can be induced and their signals read out. One of the echo signals has the water and fat in-phase and the other has the water and fat signals 180° out-of-phase. The two echoes can be induced in two different repetitions of the spin echo imaging sequence by shifting the radio frequency refocusing pulse by 2.23 msec. See, for example, Glover, et al., "Three-Point Dixon Technique For True Water/Fat Decomposition with $B_0$ Inhomogeneity Correction", Magnetic Resonance in Medicine, Vol. 18, pp. 371–383 (1991). One of the problems with this technique is that the system is typically not sufficiently linear that one can add the in-phase and out-of-phase signals to get a water only signal and subtract the in-phase and out-of-phase signals to obtain a fat only signal. The time evolution of the fat and water signals is sufficiently non-linear that in-phase and out-of-phase components do not cancel completely. To correct for this non-linearity, the Glover, et al. technique generates three echoes—one at a nominal echo time, one 2.23 msec. advanced from the nominal echo time, and one 2.23 msec. retarded from the nominal echo time. Through the use of post-processing, Glover seeks to remove the non-linearities such that components of 2.23 msec. displaced echoes substantially cancel. Another drawback of the Glover technique is that three repetitions of the imaging sequence are required to generate magnetic resonance echoes with retarded, advanced, and reference timings.

The present invention contemplates a new and improved imaging technique which overcomes the above-referenced problems and others.

SUMMARY OF THE INVENTION

In accordance with one aspect of the present invention, an improvement is provided for a magnetic resonance imaging method in which a resonance excitation pulse and a resonance refocusing pulse are applied to generate a spin echo and in which read gradients are reversed to induce first and second gradient echoes in association with each spin echo. The improvement includes inducing the spin echo when the resonance signals of a first and second species are substantially in-phase. The gradient echoes are generated at a time when the resonance signals of the first and second species are substantially 180° out-of-phase such that an in-phase spin echo and out-of-phase gradient echoes are generated in each repetition of the imaging sequence.

In accordance with a more limited aspect of the present invention, a spin echo image is reconstructed from the spin echo signals from a plurality of repetitions of the imaging sequence. First and second gradient echo images are generated from the gradient echo signals. A phase correction map is generated from the spin echo image and the first and second gradient echo images. The phase error of one of the gradient echo images is corrected with the phase map. The spin echo is additively combined with the phase corrected gradient echo image to generate a first species image. The spin echo image is subtractively combined with the phase corrected gradient echo image to generate a second species image.

In accordance with another aspect of the present invention, a method of magnetic resonance imaging is provided. A subject is disposed in a temporally constant magnetic field. A radio frequency excitation pulse is applied to excite magnetic resonance in first and second species of dipoles in the subject. The first and second species have magnetic resonance frequencies which differ by a frequency difference $\delta\omega$. A radio frequency refocusing pulse is applied a duration $\tau$ after the excitation pulse to induce a spin echo. A read gradient is applied concurrently with the spin echo. Further gradient pulses of opposite polarity are applied to induce at least first and second gradient echoes offset by times $\pm(2n+1)\pi/\delta\omega$ from the spin echo, where n is an integer. In this manner, the first and second gradient echoes have phase components that are offset by 180° from the spin echo. Phase encode gradients are applied such that the spin echo and the first and second gradient echoes have a common phase encoding. The steps are repeated with a plurality of different phase encodings to generate a plurality of differently phase encoded spin echo resonance signals, first gradient echo resonance signals, and second gradient echo resonance signals. The spin echo, first gradient echo, and second gradient echo resonance signals are reconstructed into a spin echo image, a first gradient echo image, and a second gradient echo image from which a phase correction map is generated. The phase of one of the gradient echo images is corrected with the phase map. The phase corrected image is additively combined with the spin echo image which is 180° out-of-phase with it to generate a first species image. The phase corrected image and the 180° out-of-phase spin echo image are subtractively combined to generate a second species image.

In accordance with another aspect of the present invention, an improvement is provided in a magnetic resonance imaging apparatus. A primary magnet generates a temporally constant magnetic field. A gradient magnetic field coil generates magnetic field gradients across an imaging region. One or more radio frequency coils induce and refocus magnetic resonance of dipoles of first and second species within the imaging region and receive magnetic resonance signals from the resonating first and second species dipoles. The first and second species dipoles have resonance frequencies which differ by $\delta\omega$. The improvement includes a timing and control circuit which controls the radio frequency and gradient coils to excite magnetic resonance, refocus the magnetic resonance to induce a spin echo, and to induce gradient echoes centered at times $(2n+1)\pi/\delta\omega$ before and after the center of the spin echo. A reconstruction processor reconstructs magnetic resonance signals from the spin echo into a spin echo image and reconstructs magnetic resonance signals from the first and second gradient echoes into first and second gradient echo images.

In accordance with a more limited aspect of the present invention, the magnetic resonance imaging apparatus further includes a phase map generator which generates a phase correction map from the spin echo image and the first and second gradient echo images. A circuit corrects one of the gradient echo images with the phase map to generate a phase map corrected gradient echo image. An image adder adds the spin echo to the phase corrected gradient echo image to generate a first species dipole image. An image subtractor subtractively combines the spin echo image and the phase corrected gradient echo image to generate a second species dipole image.

One advantage of the present invention is that the reference, advanced, and retarded resonance echo signals are collected in a single acquisition.

Another advantage of the present invention is that data acquisition is accelerated.

Another advantage of the present invention is that it can be used to differentiate among more than two species.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
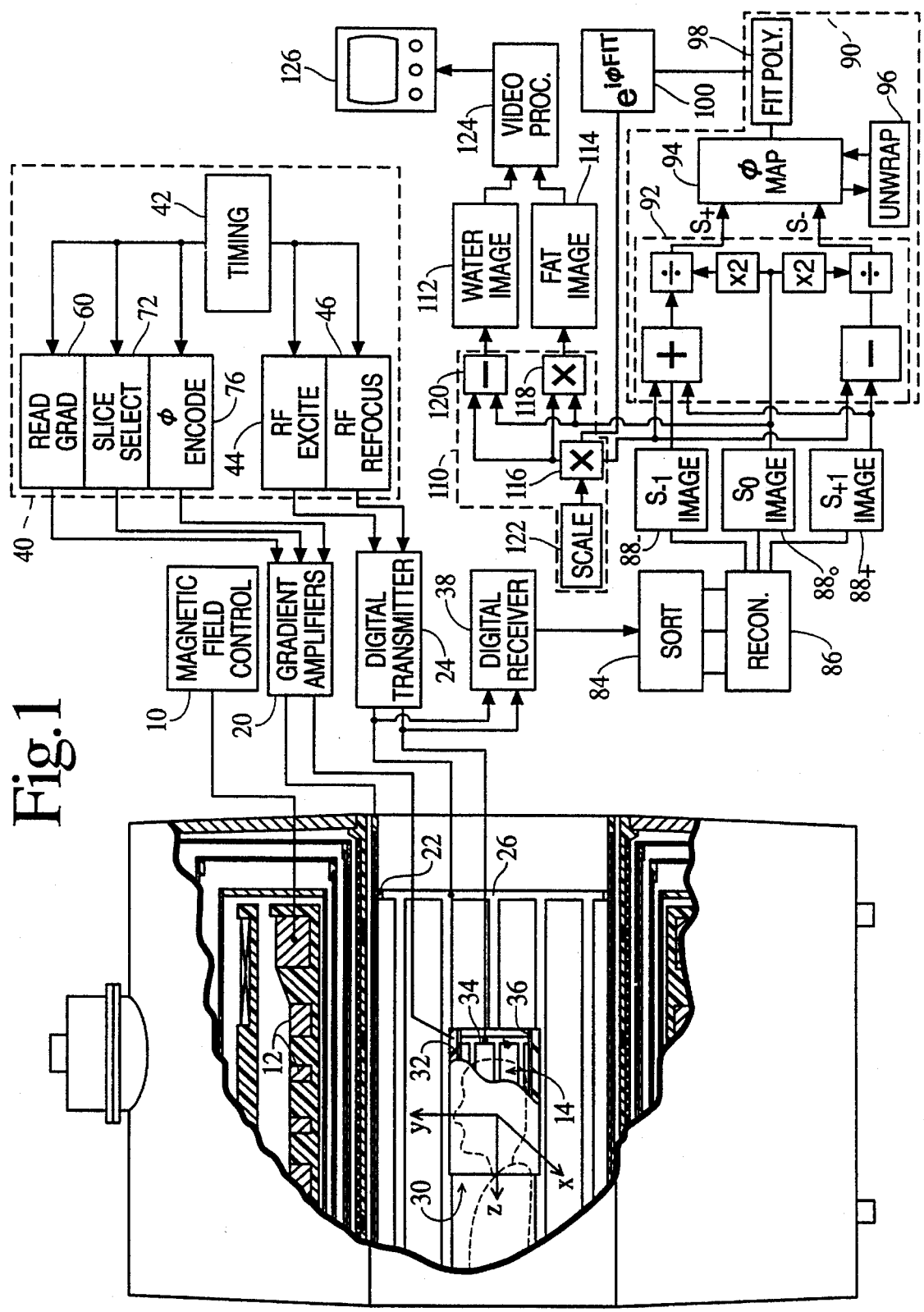
FIG. 1 is a diagrammatic illustration of a magnetic resonance imaging device in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together achieve a selected magnetic resonance manipulation. The RF pulses are used to saturate, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil optionally includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local coil can be used in conjunction with body-coil transmission. An RF screen 36 blocks the RF signals from the RF head coil from inducing eddy currents in the gradient coils and the surrounding structures.

Figure 2:
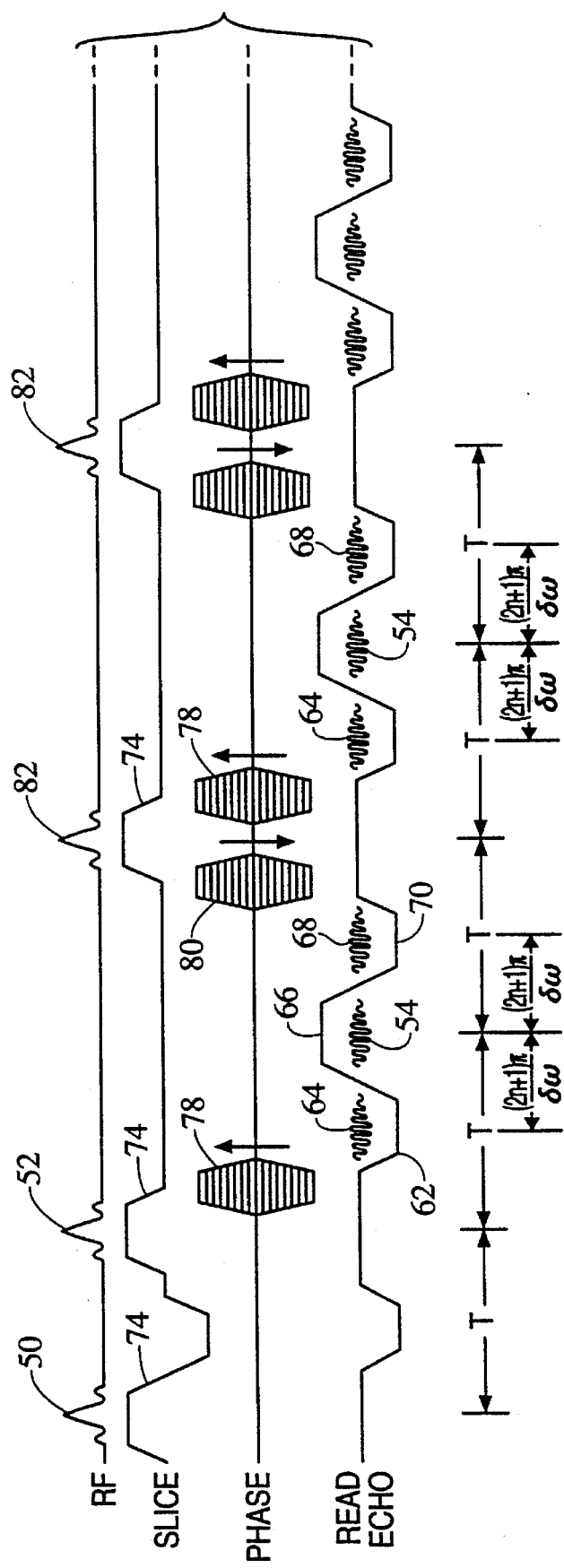
FIG. 2 is a diagrammatic illustration of a magnetic resonance imaging pulse sequence in accordance with the present invention; and, FIG. 3 is an alternate embodiment of the magnetic resonance imaging pulse sequence.

With continuing reference to FIG. 1 and further reference to FIG. 2, a sequence control circuit 40 controls the gradient pulse amplifiers, the digital transmitter, and a digital radio frequency receiver 38 to generate the pulse sequence of FIG. 2. A timing means 42 controls an excitation RF pulse generator 44 and a refocusing RF pulse generator 46. The resonance excitation pulse generator 44 controls the radio frequency transmitter to cause a resonance excitation RF pulse 50. The refocusing RF pulse generator 46 causes the radio frequency transmitter to generate a refocusing pulse 52 at a time $\tau$ after the excitation pulse. The excitation pulse followed by a refocusing pulse causes a spin echo 54 to occur a time $2\tau$ after excitation. The times $\tau$ are selected such that the fat and water resonance signals are substantially in-phase at the center of the spin echo 54. That is, the time $2\tau$ is selected to be an integer multiple of resonance oscillations at both the resonance frequency of water and the resonance frequency of fat, i.e., $2n\pi/\delta\omega$, where $\delta\omega$ is the frequency difference between the water and fat protons. Preferably, the time $\tau$ is also selected such that the fat and water are substantially in-phase when the refocusing pulse 52 is applied.

The timing means 42 also controls a read gradient control 60. The read gradient control 60 causes a first read gradient

62. The application of the read gradient 62 is timed such that a gradient echo 64 is induced at a time $(2n+1)\pi/\delta\omega$ before the center of the spin echo 54. A center lobe 66 of the read gradient is applied centered on the spin echo 54. The read gradient control again reverses to induce a second gradient echo 68 at time $(2n+1)\pi/\delta\omega$ after the spin echo and concurrently with a read gradient lobe 70. In this manner, a spin echo is generated surrounded on either side by a pair of gradient echoes which are 180° or $\pi$ out-of-phase with the spin echo. Again, for fat and water in a 1.5 Tesla field, $\pi/\delta\omega=2.23$ msec.

The timing means also controls a slice select gradient control 72 which controls the gradient amplifiers 20 to cause slice select gradient pulses 74 concurrently with the RF excitation and refocusing pulses. The slice select gradients limit the examined region to a single slice. Alternately, slab select pulses may be applied and phase encode pulses can be applied to encode the resultant spin and gradient echoes along the slice select axis. The timing means further controls a phase encode gradient controller 76 which causes the gradient amplifiers 20 to induce phase encode gradient pulses 78 before each of the spin and gradient echoes. The phase encode gradient echoes are applied such that the spin echo and its two associated gradient echoes have the same phase encoding. Preferably, a dephasing gradient pulse 80 can be applied along the phase encode axis to remove or zero the phase encoding after the last gradient echo.

In the preferred embodiment, the radio frequency refocusing pulse controller 46 causes subsequent refocusing pulses 82 at a time $2\tau$ after the first refocusing pulse and at $2\tau$ intervals thereafter. The read, slice, and phase encode gradient controllers cause like gradient pulses following each refocusing pulse to collect a second and subsequent sets of image data.

With reference again to FIG. 1, the magnetic resonance signals from the spin echo and the pair of gradient echoes are received by the whole body RF coil 26 or the localized coil 34 and conveyed to the digital receiver 38. A sorter 84 sorts the signals from the reference, retarded, and advanced echoes. A reconstruction processor 86, preferably three parallel processors, reconstructs a reference image $s_0$, a first, retarded image $s_{-1}$, and a second, advanced image $s_{+1}$. The images are defined by:

$$s_{-1}=(\rho_W-\rho_F)e^{i(-\phi+\phi_{rf})} \qquad (1a),$$

$$s_0=(\rho_W+\rho_F)e^{i(\phi_{rf})} \qquad (1b),$$

$$s_{+1}=(\rho_W-\rho_F)e^{i(+\phi+\phi_{rf})} \qquad (1c),$$

where $\rho_W$ and $\rho_F$ denote the real water and fat components, respectively, $\phi$ represents a complex phase to the local field error (also known as background phase), and $\phi_{rf}$ is the systematic phase error introduced from the RF hardware chain. The $s_{-1}$, $s_0$, and $s_{+1}$ images are stored in image memories $88_-$, $88_0$, $88_+$, respectively.

A phase map or error generator 90 analyzes the images $s_{-1}$, $s_0$, and $s_{+1}$ to determine a map of the phase error at each pixel of an imaged slice. For calculational simplicity, a transform circuit 92 generates complex phase signals $S_+$ and $S_-$ defined by:

$$S_+ = \frac{s_{+1}+s_{-1}}{2s_0} = \frac{(\rho_W-\rho_F)}{(\rho_W+\rho_F)}\cos\phi, \qquad (2a)$$

$$S_- = \frac{s_{+1}-s_{-1}}{2s_0} = \frac{(\rho_W-\rho_F)}{(\rho_W+\rho_F)}i\sin\phi. \qquad (2b)$$

The complex phase due to the local field error, i.e., the background phase, is given by:

$$Arg(Re(S_+)+i\ Im(S_-))=\phi\pm 2\pi n-\pi p \qquad (3),$$

where n denotes an integer and p varies between 0 and 1. A phase map processor 94 processes the output of the transform 92 to generate a phase map in accordance with Equation (3) for storage in a phase map memory 94. Of course, the phase map has both $2\pi$ and $\pi$ discontinuities. An unwrapping algorithm or processor 96 unwraps or adjusts the phase map to eliminate the $\pi$ and $2\pi$ discontinuities to recover the background phase. In the preferred embodiment, the background phase is fit to a polynomial $\phi_{fit}$ using a least squares processing routine 98. In the preferred embodiment in which the background phase is fit to a polynomial, it is defined by:

$$\phi_{fit}=\phi_0+a_1x+b_1y+a_2x^2+b_2y^2+c_2xy+\ldots \qquad (4).$$

The background phase $e^{\phi_{fit}}$ for each pixel is stored in a phase correction or background phase memory 100.

A corrected image generator 110 combines the phase correction and the uncorrected reconstructed images to generate phase corrected water and fat images which are stored in a water image memory 112 and a fat image memory 114. In the preferred embodiment, the water and fat images are defined by:

$$\text{water image}=|s_0+s_{-1}e^{i\phi_{fit}}| \qquad (5a),$$

$$\text{fat image}=|s_0-s_{-1}e^{i\phi_{fit}}| \qquad (5b).$$

More specifically, a multiplier 116 multiplies one of the $s_{-1}$ and $s_{+1}$ images with the phase correction from the background phase memory 110. An image adder 118 adds the complex phase corrected gradient echo image with the complex spin echo image to generate the water image (Equation (5a)). A subtraction circuit 120 subtractively combines the complex phase corrected gradient echo with the complex spin echo image to generate the fat image (Equation (5b)). Optionally, a weighting adjustment 122 is provided for multiplying the phase adjusted complex gradient echo image by an adjustable weighting factor to adjust the relative weighting between the spin echo image and the gradient echo image.

A video processor 124 converts selectable slices or other portions of the water or fat images or combinations of the two into appropriate format for display on a monitor 126 or other human readable display device.

Of course, this technique can also be used to distinguish between other than fat and water. With reference to FIG. 3, the read gradient can have five lobes for distinguishing among three species. The values of $\tau$ are selected such that the spin echo 54 occurs when all three species are in-phase. A first pair of gradient echoes 64, 68 for a first species are generated at a time $\pi/\delta\omega$ before and after the spin echo, where $\delta\omega$ is the frequency difference between the resonance frequency of the second species and the first species. A second pair of gradient echoes 130, 132 are generated a time $n\pi/\delta\omega'$ before and after the spin echo, where $\delta\omega'$ is the frequency difference between the first and third species and n is an integer, preferably 1 or an odd number. The above-described phase correction process is repeated to generate a phase correction between the first and second species and another phase correction between the first and third species. The sum of the complex gradient echo image that is adjacent to the spin echo and the complex spin echo image itself provides an image of the first species. The sum of the complex gradient echo images that are farthest from the spin echo and the complex spin echo image itself provide an image of the first species, for example, water. The subtraction of the same sets of images provide images of the second and third species, for example, fat and silicone, respectively.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging method in which a resonance excitation pulse and a resonance refocusing pulse are applied to generate a spin echo and in which read gradients are reversed in order to induce gradient echoes in association with each spin echo, the improvement comprising:

inducing the spin echo when resonance signals of a first and second species are substantially in-phase; and, generating the gradient echoes at a time when the resonance signals of the first and second species are substantially 180° out-of-phase such that an in-phase spin echo and out-of-phase gradient echoes are generated in each repetition of the imaging sequence;

reconstructing a spin echo image from the spin echo signals from a plurality of repetitions of the imaging sequence;

generating first and second gradient echo images from the gradient echo signals of the plurality of repetitions of the imaging sequence;

generating a phase correction map from the spin echo image and the first and second gradient echo images;

correcting phase error in the first gradient echo image in accordance with the phase map;

additively combining the spin echo image with the phase corrected first gradient echo image to generate a first species image; and, subtractively combining the spin echo image with the phase corrected first gradient echo image to generate a second species image.

2. In the magnetic resonance imaging method as set forth in claim 1, the improvement further comprising:

generating a first of the gradient echoes a time $\pi/\delta\omega$ before the spin echo, where $\delta\omega$ is a difference in the resonance frequencies of the first and second species; and, generating second of the gradient echoes at a time $\pi/\delta\omega$ after the spin echo.

3. In the magnetic resonance imaging method as set forth in claim 2, the improvement further comprising:

generating the spin echo at a time when resonance signals of the first species, second species, and a third species are all in-phase;

generating a third gradient echo at a time $\pi/\delta\omega'$ after the spin echo, where $\delta\omega'$ is a difference in the resonance frequencies between the first and third species; and, generating a fourth gradient echo at a time $\pi/\delta\omega'$ before the spin echo.

4. In the magnetic resonance imaging method as set forth in claim 2, the improvement further comprising the first species being water and the second species being fat.

5. In a magnetic resonance imaging method in which a resonance excitation pulse and a resonance refocusing pulse are applied to generate a spin echo add in which read gradients are reversed in order to induce first and second gradient echoes in association with each spin echo, the improvement further comprising:

inducing the spin echo when resonance signals of a first and second species are substantially in-phase; and, generating the gradient echoes at a time when the resonance signals of the first and second species are substantially 180° out-of-phase such that an in-phase spin echo and out-of-phase gradient echoes are generated in each repetition of the imaging sequence;

applying an additional refocusing RF pulse after the spin echo and the first and second gradient echoes to induce a second spin echo at a time when the first and second species are again in-phase; and, generating a pair of additional gradient echoes after the second refocusing pulse at times when the first and second species are 180° out-of-phase.

6. A method of magnetic resonance imaging comprising:

(a) disposing a subject in a temporally constant magnetic field;

(b) applying a radio frequency excitation pulse to excite magnetic resonance in first and second species of dipoles in the subject, which first and second species have magnetic resonance frequencies which differ by a frequency difference $\delta\omega$;

(c) applying a radio frequency refocusing pulse for inducing a spin echo a duration $\tau$ after the refocusing pulse;

(d) applying a read gradient concurrently with the spin echo;

(e) applying further gradient pulses of opposite polarity to induce at least first and second gradient echoes offset by times $\pm(2n+1)\pi/\delta\omega$ from the spin echo, where n is an integer, such that the first and second gradient echoes have phase components that are offset by 180° from the spin echo;

(f) applying phase encode gradients such that the spin echo and the first and second gradient echoes have a common phase encoding;

(g) repeating at least steps (b)–(f) with different phase encode gradients to generate a plurality of differently phase encoded spin echo resonance signals, first gradient echo resonance signals, and second gradient echo resonance signals;

(h) reconstructing the spin echo, the first gradient echo, and the second gradient echo resonance signals into a spin echo image, a first gradient echo image, and a second gradient echo image;

(i) generating a phase correction map from the spin echo and first and second gradient echo images;

(j) correcting a phase of one of the gradient echo images with the phase map;

(k) additively combining the phase corrected image with the spin echo image which is 180° out-of-phase therewith to generate a first species image; and, (l) subtractively combining the phase corrected image with the 180° out-of-phase spin echo image to generate a second species image.

7. The method as set forth in claim 6 where n=1.

8. The method as set forth in claim 6 wherein the first and second gradient echoes are induced at equal time intervals before and after the spin echo.

9. The method as set forth in claim 6 wherein in step (i), the phase correction map is a phase image and step (j) includes combining the phase image with one of the first and second gradient echo images.

10. The method as set forth in claim 6 wherein step (i) includes combining the gradient echo and spin echo images and normalizing the gradient echo images with the spin echo image.

11. The method as set forth in claim 6 wherein the spin echo is generated when the first and second species are in-phase with each other and gradient echoes are generated when the first and second species are 180° out-of-phase with each other.

12. The method as set forth in claim 11 wherein step (b) further includes exciting resonance in a third species of dipole within the subject, the third species having a resonance frequency which differs from the first species resonance frequency by a frequency difference $\delta\omega'$, the method further including:

inducing third and fourth gradient echoes centered at times $m\pi/\delta\omega'$ before and after a center of the spin echo, where m is an odd integer;

generating a phase correction map based on the third and fourth gradient echoes and the spin echo;

correcting one of the third and fourth gradient echo images with the phase map;

subtractively combining the spin echo and the phase error corrected one of the third and fourth gradient echo images to generate a third species image;

reconstructing magnetic resonance signals from the third and fourth gradient echoes into third and fourth gradient echo images, respectively.

13. In a magnetic resonance imaging apparatus which includes a primary magnet for generating a temporally constant magnetic field, a gradient magnetic field coil for generating magnetic field gradients across an imaging region, one or more radio frequency coils for inducing and refocusing magnetic resonance of dipoles of first and second species within the imaging region and for receiving magnetic resonance signals from the resonating first and second species dipoles in the examination region, the first and second species dipoles having resonance frequencies which differ by a frequency difference $\delta\omega$, the improvement comprising:

a timing and control circuit for controlling the radio frequency and gradient coils to excite magnetic resonance, refocus the magnetic resonance to induce a spin echo, and inducing gradient echoes centered at times $n\pi/\delta\omega$ before and after a center of the spin echo, where n is an odd integer;

a reconstruction processor for reconstructing magnetic resonance signals from the spin echo into a spin echo image, for reconstructing magnetic resonance signals from the gradient echoes into a first gradient echo image and a second gradient echo image;

a phase mad generator which generates a phase correction map from the spin echo image and the first and second gradient echo images.

14. In a magnetic resonance imaging apparatus which includes a primary magnet for generating a temporally constant magnetic field, a gradient magnetic field coil for generating magnetic field gradients across an imaging region, one or more radio frequency coils for inducing and refocusing magnetic resonance of dipoles of first and second species within the imaging region and for receiving magnetic resonance signals from the resonating first and second species dipoles in the examination region, the first and second species dipoles having resonance frequencies which differ by a frequency difference $\delta\omega$, the improvement comprising:

a timing and control circuit for controlling the radio frequency and gradient coils to excite magnetic resonance, refocus the magnetic resonance to induce a spin echo, and inducing first and second gradient echoes centered at times $n\pi/\delta\omega$ before and after a center of the spin echo, where n is an odd integer;

a reconstruction processor for reconstructing magnetic resonance signals from the spin echo into a spin echo image, for reconstructing magnetic resonance signals from the first gradient echo into a first gradient echo image, and for reconstructing magnetic resonance signals from the second gradient echo into a second gradient echo image;

a phase map generator which generates a phase correction map from the spin echo image and the first and second gradient echo images;

a circuit which corrects one of the gradient echo images with the phase map to generate a phase map corrected gradient echo image;

an image adder which adds the spin echo and the phase corrected gradient echo images to generate a first species dipole image;

an image subtractor which subtractively combines the spin echo and the phase corrected gradient echo images to generate a second species dipole image.

15. In a magnetic resonance imaging method in which a resonance excitation pulse and resonance refocusing pulse are applied to generate a spin echo and in which a read gradient is reversed in order to induce a trailing gradient echo in association with each spin echo, the improvement comprising:

reversing a polarity of the read gradient to induce a leading gradient echo at a time when resonance signals from first and second species are substantially 180° out-of-phase;

reading out the leading gradient echo when the read gradient has a first polarity;

inducing the spin echo when resonance signals of a first and second species are substantially in-phase;

reading out the spin echo when the read gradient has a second polarity opposite to the first polarity;

reversing the polarity of the read gradient to induce the trailing gradient echo at a time when the resonance signals of the first and second species are substantially 180° out-of-phase such that an in-phase spin echo and out-of-phase leading and trailing gradient echoes are generated in each repetition of the imaging sequence;

reading out the trailing gradient echo when the read gradient has the first polarity; and, generating a phase correction map from the leading and trailing gradient echoes and the spin echo.

16. In the method as set forth in claim 15, the improvement further including phase encoding the spin and gradient echoes with a common phase encoding in each of a plurality of repetitions.

\* \* \* \* \*